| United States Patent [19] | [11] Patent Number: 4,942,110 |
| Genovese et al. | [45] Date of Patent: Jul. 17, 1990 |

[54] HIGH RESOLUTION CONDUCTOR PATTERNING

[75] Inventors: Frank C. Genovese; Thomas E. Orlowski, both of Fairport, N.Y.

[73] Assignee: Xerox Corporation, Stamford, Conn.

[21] Appl. No.: 237,804

[22] Filed: Aug. 29, 1988

[51] Int. Cl.[5] .......................... G03C 11/00; B05D 3/06
[52] U.S. Cl. ................................... 430/198; 430/311; 430/322; 430/330; 427/43.1; 427/53.1; 219/121.85
[58] Field of Search ............... 430/198, 311, 325, 327, 430/330, 945, 322; 427/43.1, 53.1; 204/129.1; 219/121.6, 121.73, 121.85

[56] References Cited

U.S. PATENT DOCUMENTS

| 4,061,799 | 12/1977 | Brewer | 427/43 |
| 4,063,949 | 12/1977 | Uhlig et al. | 96/27 E |
| 4,159,414 | 6/1979 | Suh et al. | 219/121 |
| 4,454,167 | 6/1984 | Bernot et al. | 430/198 |
| 4,467,026 | 8/1984 | Ogawa | 430/296 |
| 4,477,324 | 10/1984 | Cline | 204/129.1 |
| 4,814,259 | 3/1989 | Newman et al. | 430/945 |

OTHER PUBLICATIONS

"Thick Film Fine Pattern Formation by a Photolithographic Process" by Watanabe, 1979, pp. 27–36.

*Primary Examiner*—Jose Dees
*Assistant Examiner*—Donald J. Loney
*Attorney, Agent, or Firm*—Ronald F. Chapuran

[57] ABSTRACT

A technique for generating high resolution resistor or conductor patterns on uneven surfaces by focusing a $CO_2$ laser beam to locally render insoluable suitable thick film resistor or conductor material that has been uniformly coated onto a substrate and oven-dried to remove organic coating solvents. Patterns are generated by scanning the laser beam across the coated substrate, and the coating is hardened and adheres to the substrate where it has been exposed by the laser beam.

5 Claims, 2 Drawing Sheets

HIGH RESOLUTION CONDUCTOR PATTERNING

BACKGROUND OF THE INVENTION

This invention relates to Laser hardening and, in particular, to a method of high resolution thick film material patterning.

The prior art is replete with methods for providing thick film patterns such as resistor and conductor patterns for microelectronic circuitry on switchable substrates. Various thin film methods are known such as evaporation, sputtering, and photo resist etching to provide electrical patterns. Thick film techniques are also known such as silk screening a conductive ink onto the substrate in a desired pattern, fixing the substrate, and then laser trimming the pattern to the desired specifications. This process requires a chamber containing suitable gases or other compounds maintained under the right condition for processing. Merely heating the silicon by itself will not give the desired result. As another example, electrically conducting patterns can be deposited on silicon subsrates by selectively directing a laser beam of suitable power onto the silicon surface to heat it locally and precipitate a metal conductive coating in a pattern corresponding to the heated portions of the surface. Various applications of pattern hardening of material onto a substrate are also disclosed in the following references.

U.S. Pat. No. 4,061,799 to Brewer discloses a method of patterning styrene-diene block copolymer electron beam resists. A thin film of styrene-diene block copolymer is applied to a support and is subjected to an electron beam scan in a vacuum which irradiates part of the film according to a programmed pattern. The exposed section becomes insoluble in a solvent while the unexposed area remains soluble and is therefore dissolved and removed. The desired pattern remains.

U.S. Pat. No. 4,063,949 to Uhlig et al. discloses a process utilizing laser beams for the preparation of planographic printing forms. A recording material comprising a support layer of anodically oxidized aluminum and a recording layer is irradiated with a laser beam, thereby rendering the exposed portions of the recording layer insoluble. The non-irradiated portions can be removed by washing with a developer liquid.

U.S. Pat. No. 4,159,414 to Suh et al. discloses a method for forming electrically conductive paths. A substrate, comprising a polymer material having a metal compound and a metal oxide incorporated as a filler, is heated by a laser beam at desired locations. The temperature is sufficient to reduce the metal compound to its elemental state, thus forming the desired electrically conductive paths.

U.S. Pat. No. 4,467,026 to Ogawa discloses a process for drawing patterns with extremely fine features in the production of VLSI, LSI and IC Systems. An electron beam is used to write a pattern over a resist layer on a wafer and the resist layer is exposed by X-rays.

U.S. Pat. No. 4,477,324 to Cline discloses a technique for making eutectic fine wire arrays. Arrays are made by directionally solidifying the component of a eutectic alloy system as a thin film and consequently removing at least one of the phases.

There are various difficulties with the prior art methods. For example, it is very difficult if not impossible to screen a pattern onto an uneven surface. Also, thin film processes can be relatively expensive because of materials and techniques. On the other hand, thick film techniques usually offer relatively low resolution. Also, methods using a laser to burn away all but the desired pattern require the relatively costly and excessive use of a high power laser and the process is relatively slow.

It is an object of the present invention, therefore, to provide a new and improved method of laser forming resistors, conductors and insulators, in particular, in providing a relatively inexpensive method of providing patterns on uneven surfaces using thick film materials and yet provide relatively high resolution. Further advantages of the present invention will become apparent as the following description proceeds, and the features characterizing the invention will be pointed out with particularity in the claims annexed to and forming a part of this specification.

SUMMARY OF THE INVENTION

Briefly, the present invention is a technique for generating high resolution resistor or conductor patterns on an uneven surface by focusing a suitable laser beam to locally harden suitable thick film resistor or conductor material that has been uniformly coated onto a substrate and oven-dried to remove organic coating solvents. Patterns are generated by scanning the laser beam across the coated substrate, or by moving the substrate by computer control with the laser beam fixed. The thick film coating is hardened and adheres to the substrate where it has been exposed by the laser beam. Unexposed coating material is easily removed by rinsing in alcohol, or any other suitable solvent or by any other method capable of removing unattached material. Once the pattern has been exposed and developed, the remaining thick film material is fired with a suitable time-temperature profile to guarantee normal operational characteristics.

BRIEF DESCRIPTION OF THE DRAWINGS

For a better understanding of the present invention, reference may be had to the accompanying drawings wherein the same reference numerals have been applied to like parts and wherein:

FIGS. 1 and 2 illustrate a typical prior art product and overcoating and.

DESCRIPTION OF THE PREFERRED EMBODIMENT

In general, in accordance with the present invention, a suitable thick film material is uniformly applied to a substrate by dip coating, doctoring or any other suitable method. The coated substrate is then oven dried to remove organic solvents from the coating. Patterns are generated by a focused $CO_2$ laser beam (with line width dependent upon beam diameter, scan rate and laser power) by scanning the laser beam across the coated substrate. It should be noted that the patterns can be generated by any other suitable laser such as an argon-ion laser beam. The coating is made to adhere to the substrate where it has been exposed by the laser beam. Unexposed coating material is easily removed (and may be recoverable) by rinsing in a suitable solvent such as alcohol. Once the pattern has been exposed and "developed", and the remaining patterned thick film material is fired with the time-temperature profile specified by the material manufacturer in order to guarantee normal operational characteristics (typical thick film firing temperatures range from 300°-850° C.).

Figure 1:
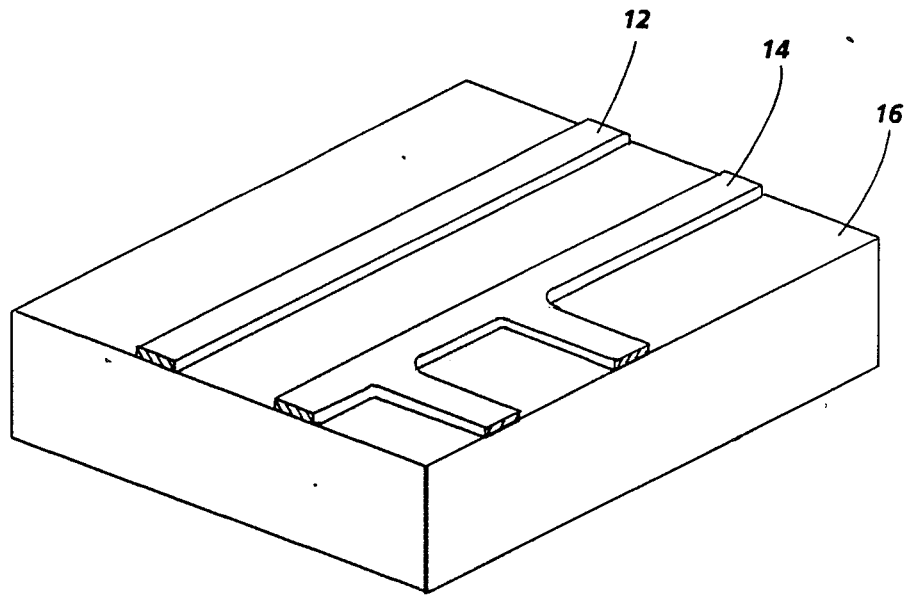
Figure 2:
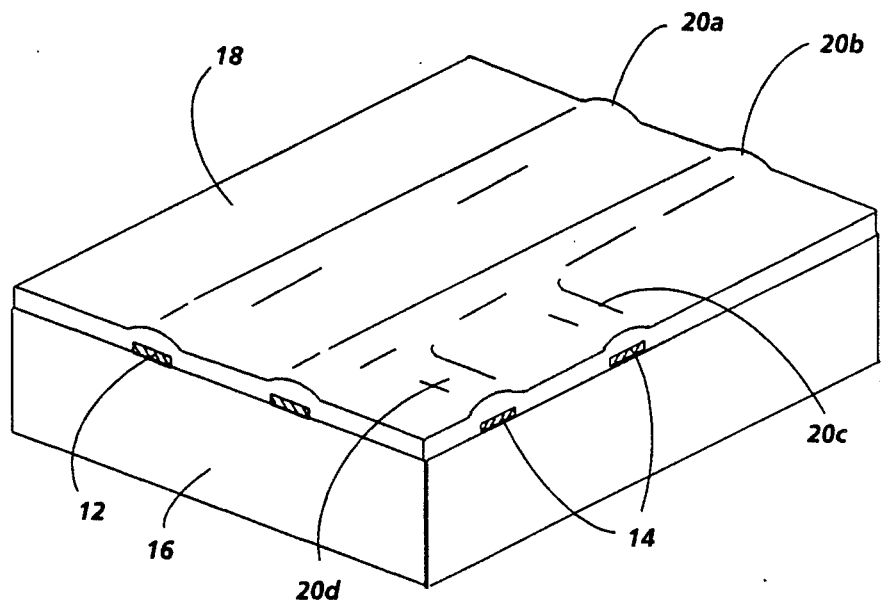

With reference to FIGS. 1 and 2, there is shown a typical patterned substrate produced by conventional thick film techniques or the method of the present invention. In particular, patterns 12 and 14 are applied to substrate 16 by silk screening, deposition or any other suitable method. The patterns 12 and 14 can be metal traces, resistive coatings or any material to provide conductors, resistors, insulators or any preferred electrical element or connection. FIG. 2 illustrates a layer of glass 18 or any other suitable insulator material to partition the patterns 12 and 14 from other patterns or layers to be provided on the substrate. As illustrated, the layer of glass 18 exhibits an uneven or wavy surface as shown at 20a, 20b, 20c, and 20d due to underlying thick film structure. This uneven surface presents a substantial difficulty in providing the next layer of patterns. For example, it would be very difficult to silk screen a complex high resolution pattern on the uneven surface 18.

Figure 3:
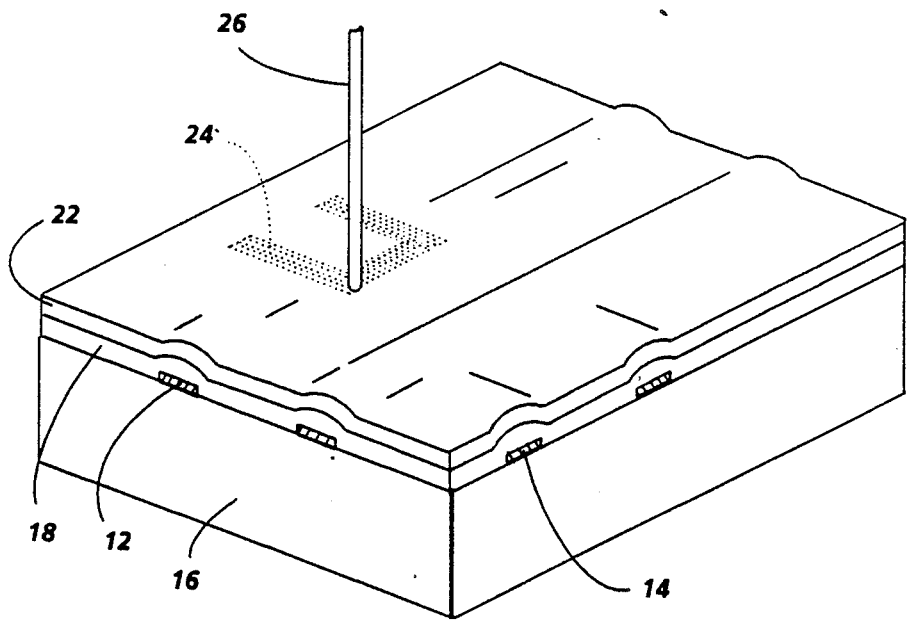
FIGS. 3 and 4 are an illustration of an overlying high resolution pattern produced in accordance with the present invention.
Figure 4:
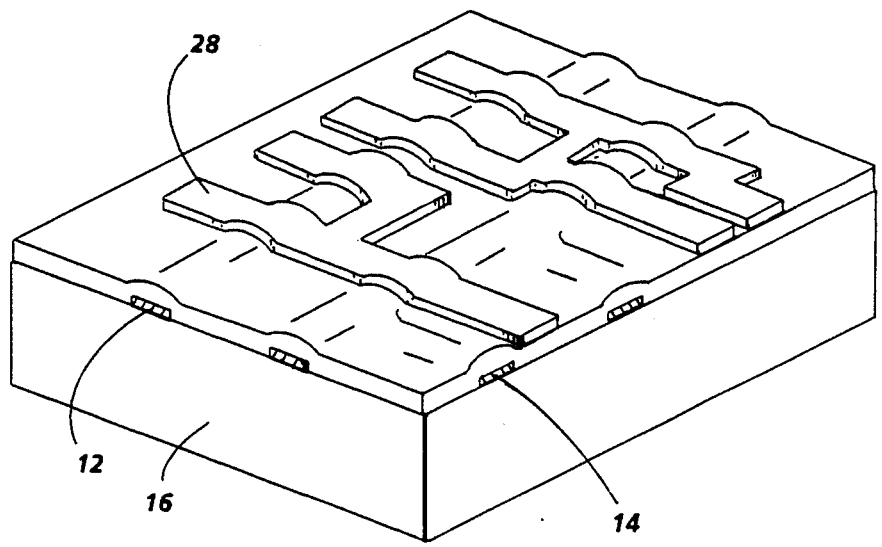

In accordance with the present invention, with reference to FIGS. 3 and 4, there is illustrated a method to easily and accurately produce patterns on uneven surface 18. Initially, a suitable thick film material is uniformly applied to the surface 18 by any suitable method to produce layer 22 and the layer 22 is then oven dried to remove organic coating solvents. Next a pattern 24 is generated by the focused $CO_2$ laser beams 26 by scanning the laser beam 26 across the layer 22. The pattern 24 adheres to the substrate where it has been exposed by the laser beam. Unexposed portions of layer 22 are removed by rinsing in alcohol resulting in a pattern 28 supported on surface 18 as shown in FIG. 4. Once the pattern has been exposed and "developed", it is fired according to a suitable time-temperature profile it should be noted that the pattern 28 conforms to the waves and uneven portions of surface 22.

A laser power of 1 watt and a scan rate of 2 mm/sec is typical. Line width is determined by the focused laser beam diameter (~250 microns). The lines are uniform and adhere strongly to the substrate due to the action of the laser beam. In accordance with the present invention, it is possible to generate 250 micron lines using an 275 millimeter focal length lens, and 175 micron lines using a 125 millimeter focal length lens. In both cases the line width is approximately equal to the laser beam diameter determined by the system F# (ratio of the focal length to the diameter of the beam at the lens). It is believed that the ultimate resolution is limited by the diffraction-limited laser spot size (less than ~50 microns for a typical $TEM_{00}$ $CO_2$ laser) with allowance for some diffusion of the thermal energy in the absorbing coating and substrate. It should be noted that a laser spot sized approximately 5 microns could be achieved with an argon laser. Also, the process is applicable to conductors, resistors, insulators, and any other thick film material.

It should also be noted that the reasonable depth-of-focus properties of the laser imaging lens allows easier fabrication of multilayered structures where conductive traces, resistors or insulators have to be formed over the steps created by underlying structures. This is virtually impossible to do at high resolution with silk screens because the screen must contact the substrate snugly in order to define the areas where ink is to be deposited with precision. Screens are eliminated with the laser method allowing faster turnaround redesign of experimental and prototype patterns. A system of making "repairs" by ablating unwanted deposits (these inks are routinely laser trimmed) or selectively recoating damaged areas with an interactive computer system is contemplated within the scope of this invention.

While there has been illustrated and described what is at present considered to be a preferred embodiment of the present invention, it will be appreciated that numerous changes and modifications are likely to occur to those skilled in the art, and it is intended in the appended claims to cover all those changes and modifications which fall within the true spirit and scope of the present invention.

We claim:

1. A method of laser forming a hardened pattern having electrical properties on an uneven surface of a substrate comprising the steps of:

coating the uneven surface of the substrate with a thick film material, drying the coating to remove organic coating solvents, generating a pattern on the substrate by scanning a beam of the laser across the coated substrate with enough power to render the generated pattern insoluble to solvent, the laser providing a spot size of less than 50 microns, applying solvent to the substrate to wash away the excess thick film material, leaving the laser generated pattern, and firing the substrate to fix the pattern to the substrate.

2. The method of claim 1 wherein the laser is a $CO_2$ laser.

3. The method of claim 1 wherein the laser is an argon-ion laser.

4. The method of claim 1 wherein the laser is a continuous wave or pulsed laser.

5. The method of claim 1 wherein the pattern is a resistor, conductor, or insulator.

* * * * *